(12) United States Patent
Kobayashi et al.

(10) Patent No.: US 6,379,508 B1
(45) Date of Patent: Apr. 30, 2002

(54) METHOD FOR FORMING THIN FILM

(75) Inventors: Kazunori Kobayashi; Tomoaki Ishihara; Akira Nakamura, all of Toyama; Toshihide Nobusada, Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/268,760

(22) Filed: Mar. 16, 1999

(30) Foreign Application Priority Data

Mar. 18, 1998 (JP) .......................................... 10-068048

(51) Int. Cl.⁷ ............................................. C23C 14/34
(52) U.S. Cl. ........................... 204/192.15; 204/192.29; 204/192.1; 204/192.12; 204/298.08
(58) Field of Search ....................... 204/192.15, 192.29, 204/192.1, 192.12, 298.08

(56) References Cited

U.S. PATENT DOCUMENTS

| | | | | |
|---|---|---|---|---|
| 4,401,539 A | * | 8/1983 | Abe et al. ............... | 204/192.12 |
| 4,410,407 A | * | 10/1983 | Macaulay .............. | 204/192.12 |
| 4,782,477 A | * | 11/1988 | Ichihara et al. ........ | 204/192.12 |
| 5,605,610 A | * | 2/1997 | Ishibashi ............... | 204/192.29 |
| 5,618,388 A | * | 4/1997 | Seeser et al. .......... | 204/192.12 |
| 5,693,238 A | | 12/1997 | Schmitt et al. ............... | 216/67 |
| 6,132,569 A | * | 10/2000 | Shiozaki ................ | 204/192.27 |

FOREIGN PATENT DOCUMENTS

| | | | |
|---|---|---|---|
| EP | 869 543 | 10/1998 | ........... H01L/21/00 |
| JP | 5-36633 | 2/1993 | |

OTHER PUBLICATIONS

"The Influence of Target Oxidation and Growth-Related Effects on the Electrical Properties of Reactively Sputtered Films of Tin-Doped Indium Oxide"; Buchanan, M. et al.; Thin Solid Films, Jun. 26, 1981, vol. 80, No. 4, pp. 373–382.
European Search Report.

* cited by examiner

*Primary Examiner*—Mark F. Huff
*Assistant Examiner*—Daborah Chacko-Davis
(74) *Attorney, Agent, or Firm*—Merchant & Gould PC

(57) ABSTRACT

A method for forming a thin film of the present invention includes the steps of performing sequentially first idling discharge under application of a first level of discharge power upon gas introduction (period $t_{1a}$), intermediate idling discharge under application of a second level of discharge power lower than the first level (period $t_{1b}$), and second idling discharge at the first level of discharge power (period $t_{1c}$), so that the pressure of sputtering gas and an intermediate product produced during the idling discharge are stabilized. The discharge power is lowered to the second level, the shutter is opened, and an ITO thin film, for example, is formed on a first substrate ($t_2$). Thereafter, the same cycles are repeated to form ITO thin films on substrates.

19 Claims, 9 Drawing Sheets

METHOD FOR FORMING THIN FILM

BACKGROUND OF THE INVENTION

1. Field of the Invention

The present invention relates to a method for forming a thin film on a substrate. More particularly, the present invention relates to a method for forming a thin film that is suitable for forming a transparent conductive film used in an image display apparatus such as a liquid crystal display.

2. Description of the Prior Art

Generally, a pixel electrode substrate used in a liquid crystal panel is produced by the following method. A transparent conductive substrate is first produced by forming a thin film made of indium tin oxide (hereinafter, referred to as "ITO") by reactive sputtering as a transparent conductive film on the entire surface of a transparent substrate. Then, pixel electrode patterning is performed with respect to the ITO thin film by etching so as to produce a pixel electrode substrate.

The reactive sputtering for the ITO thin film used in this method is performed by introducing inert gas and reactive gas into a sputtering apparatus. A sputtering target for discharge power application, a substrate holder for holding a substrate to be treated, a shutter located between the sputtering target and the substrate holder are provided in the sputtering apparatus.

Prior to the formation of a thin film by reactive sputtering, sputtering discharge is performed with gas introduction and discharge power application while the shutter is closed before a substrate to be treated is introduced into the sputtering chamber (hereinafter, the sputtering discharge without a substrate to be treated being introduced in the sputtering chamber is referred to as "idling discharge"), in order to stabilize a plasma discharge state in sputtering discharge.

Conventionally, it has been common that this idling discharge is performed for a short time such as 3 to 5 minutes and at most about 10 minutes.

Furthermore, the discharge power during the formation of a thin film is set to a low power value in order to stabilize reactive sputtering. On the other hand, the discharge power during the idling discharge is set to a power higher than the discharge power applied for the formation of a thin film in order to speed up the cleaning of the surface of the target for shortening the treatment time and to reduce variations in the plasma discharge state caused by opening and closing the shutter.

Conventionally, a black and white liquid crystal panel has been displayed by determining at each pixel whether the pixel is bright or dark, i.e., whether or not light is transmitted. For this reason, the quality of a transparent conductive film is determined by whether or not light is transmitted, and does not significantly depend on the transmittance of the transparent conductive film.

However, since a color liquid crystal panel is displayed with three primary colors of red, green and blue, a non-uniform transmittance in the transparent conductive substrate results in unintended reproduction of colors in the liquid crystal panel. Furthermore, when transparent conductive substrates have significantly different transmittances from each other, liquid crystal panels that have been produced with the transparent conductive substrates reproduce colors differently. Therefore, in the production of color liquid crystal panels, when transparent conductive films are formed on a large number of substrates, it is important for each of the transparent conductive substrates to have a uniform transmittance within its own substrate. Moreover, it is important for all the transparent conductive substrates to have a uniform transmittance.

Generally, the sheet resistance and the transmittance of a transparent conductive film formed of a metal oxide are correlated closely. Stable sheet resistance and low levels of dispersion in the sheet resistance result in stable transmittance. However, as a result of study in detail by the inventors as to conventional methods for forming a thin film such as a transparent conductive film, the inventors found a first problem in that the dispersion in the sheet resistance of transparent conductive films successively formed on a plurality of substrates by reactive sputtering and the sheet resistance in each of the transparent conductive substrates depends on the order of the formation of the films, namely, the order of the introduction of substrates to be treated to the sputtering chamber.

The first problem in conventional methods for forming a thin film will be described with reference to FIGS. 6, 7, 8 and 9.

FIG. 6 shows a sequence of discharge power applied for formation of ITO thin films on 50 substrates to be treated. First, gas is introduced into a sputtering chamber, a discharge power of 450 W is applied for idling discharge and a first substrate to be treated is transported into a sputtering chamber and positioned on a substrate holder (during a period shown as $T_1$ in FIG. 6). Then, the discharge power is dropped to 400 W and the shutter is opened, and an ITO thin film is formed on the first substrate to be treated so that a first transparent conductive substrate is produced (during a period shown as $T_2$ in FIG. 6). The shutter is closed and the discharge power is raised to 450 W, and the first transparent conductive substrate is transported out from the sputtering chamber before a second substrate to be treated is transported into the sputtering chamber and positioned in the substrate holder (during a period shown as $T_3$ in FIG. 6). Then, the discharge power is dropped to 400 W and the shutter is opened, and an ITO thin film is formed on a second substrate to be treated (during a period shown as $T_4$ in FIG. 6). The same film-formation cycles are repeated until an ITO thin film is formed on a $50^{th}$ transparent conductive substrate (during a period shown as $T_{100}$ in FIG. 6). Then, the shutter is closed and the discharge power is raised to 450 W, and the $50^{th}$ transparent conductive substrate is transported out from the sputtering chamber (during a period shown as $T_{101}$ in FIG. 6). Then, the discharge power is stopped and thus the process for forming the transparent conductive films is completed.

FIG. 7 shows changes in the sheet resistance of the transparent conductive substrate according to the order of the ITO thin film-forming process by the conventional method for forming a thin film as described above. FIG. 8 shows the dispersion in the sheet resistance in each transparent conductive substrate. As seen from FIGS. 7 and 8, the sheet resistance is high and the dispersion in the sheet resistance is large with respect to the ITO thin films on the first to fifth transparent conductive substrates, i.e., the substrates treated with reactive sputtering in an early stage of the sequential forming process. The dispersion in the sheet resistance represents a difference from an average value of values obtained by measuring a sheet resistance at 5 points on a surface of a transparent conductive substrate with a 150 mm diameter.

The gas state in the sputtering chamber during the formation of ITO thin films by the conventional method shown in FIG. 6 is analyzed with a quadruple mass spectrometer. FIG. 9 shows pressure changes of introduced gases, i.e., argon (Ar), hydrogen ($H_2$) and oxygen ($O_2$), and water ($H_2O$) calculated with mass numbers obtained by the mass analysis.

FIG. 9 shows the results with respect to a period before start of discharge, an idling discharge period 60, and a period until a thin film is formed on a $10^{th}$ substrate in the period for sequentially forming ITO thin films on the 50 substrates. Sharp falling portions seen in the pressure change result of each gas are caused by the switching of discharge power between 450 W for idling discharge and 400 W for formation of the thin films and the opening and closing of the shutter. The ITO thin films are formed on sequentially introduced substrates during periods segmented by the falling portions.

As seen from FIG. 9, the pressures of Ar, $H_2$ and $O_2$ are substantially constant except for the initial period with gas introduction and the start of idling discharge and the falling portions, whereas the pressure of $H_2O$ changes along a general shape of a gentle slope during a period 61 from the initial period until the formation of a thin film on the fifth transparent substrate. $H_2O$ is present as a residual gas in the sputtering chamber prior to the gas introduction and the idling discharge. Compared with the pressure of the $H_2O$ at that period, the pressure of $H_2O$ is higher after the gas introduction and the idling discharge. This means that $H_2O$ increases as an intermediate product formed from introduced $H_2$ and $O_2$ by sputtering discharge. Furthermore, the pressure of the $H_2O$ formed by the sputtering discharge changes along a general shape of a gentle slope during a period 61 from the start of idling discharge until the formation of a thin film on the fifth transparent substrate.

The fact that the pressure of $H_2O$ is stable after the formation of a thin film on the sixth substrate indicates that the pressure of $H_2O$ increases because $H_2O$ as an intermediate product is produced in large amount after the start of idling discharge, and the pressure of $H_2O$ becomes stable as a certain period has passed. Since the other introduced gases are present in a large amount, compared with $H_2O$, the change after the start of idling discharge that is seen in $H_2O$ was not detected.

The above-described analysis results together with the reference to FIG. 6 suggest that the changes in the pressures and the ratio of the gas partial pressures since the gas introduction and the start of idling discharge influence the sheet resistance of the transparent conductive films and the dispersion in the sheet resistance in each transparent conductive substrate.

Furthermore, as a result of study in detail of the inventors as to conventional methods for forming a thin film such as a transparent conductive film, the inventors found a second problem as follows when a plurality of substrates are successively subjected to reactive sputtering. In the case where the idling discharge power after the start of reactive sputtering is set higher than the discharge power for formation of ITO thin films, residue appears after etching is performed to form pixel electrode pattern with respect to the transparent conductive substrates that have been produced early in the order of the formation of the thin films.

When the idling discharge power after the start of sputtering discharge is set higher, particles sputtered from a sputtering target reach a substrate in a high energy state because the particles have been exited during the idling discharge. This results in changed quality of the ITO films, thus causing such residue.

SUMMARY OF THE INVENTION

Therefore, with the foregoing in mind, it is the object of the present invention to provide a method for forming uniform thin films regardless of the order of the formation of the films.

An embodiment of a method for forming a thin film of the present invention includes the steps of performing idling discharge for reactive sputtering with the introduction of sputtering gas and the application of discharge power in a sputtering chamber until a pressure of a product produced from the sputtering gas by the idling discharge reaches a stationary state; and forming films on substrates in the sputtering chamber by the reactive sputtering while introducing the substrates to be treated into the sputtering chamber and removing the substrates from the sputtering chamber, one at a time, sequentially.

According to this embodiment, the pressure of introduction gas produced after the start of the idling discharge and the pressure of an intermediate product produced by plasma can be stable. This embodiment has an effect, especially on solving the first problem.

Furthermore, another embodiment of a method for forming a thin film includes the steps of performing idling discharge for reactive sputtering with the introduction of sputtering gas and the application of discharge power in a sputtering chamber in such manner that a discharge power at the idling discharge is not more than a discharge power at the reactive sputtering during at least a part of the period; and forming films on substrates in the sputtering chamber by the reactive sputtering while introducing the substrates to be treated into the sputtering chamber and removing the substrates from the sputtering chamber, one at a time, sequentially.

This embodiment prevents significant excitation of particles sputtered from a sputtering target. This embodiment has an effect, especially on solving the second problem.

The present invention provides a great advantage when the thin film is a metal oxide (especially, indium tin oxide, indium oxide or tin oxide). Furthermore, the present invention is particularly advantageous when the thin film is a transparent conductive film such as an ITO film.

As described above, according to the present invention, in successive formation of thin films on a plurality of substrates by reactive sputtering, the pressure of sputtering gas and the pressure of an intermediate product produced during idling discharge are stabilized by performing idling discharge after the start of the reactive sputtering. Thus, the present invention achieves a method for forming a thin film that can provide all the substrates from the first substrate to the last substrate with constant film characteristics, and a method for forming uniform thin films regardless of the order of the film formation. Therefore, the present invention can achieve good thin film characteristics for a transparent conductive film used in a liquid crystal panel or the like.

Furthermore, according to the present invention, even if thin films are formed on a plurality of substrates, thin films having good characteristics and quality can be formed, regardless of the order of the film formation, by setting a discharge power at idling discharge after the start of the reactive sputtering to a value equal to or lower than at the reactive sputtering.

These and other advantages of the present invention will become apparent to those skilled in the art upon reading and understanding the following detailed description with reference to the accompanying figures.

DESCRIPTION OF THE PREFERRED EMBODIMENTS

EXAMPLE 1

Hereinafter, a method for forming a thin film according to a first embodiment of the present invention will be described with reference to the accompanying drawings.

Figure 1:
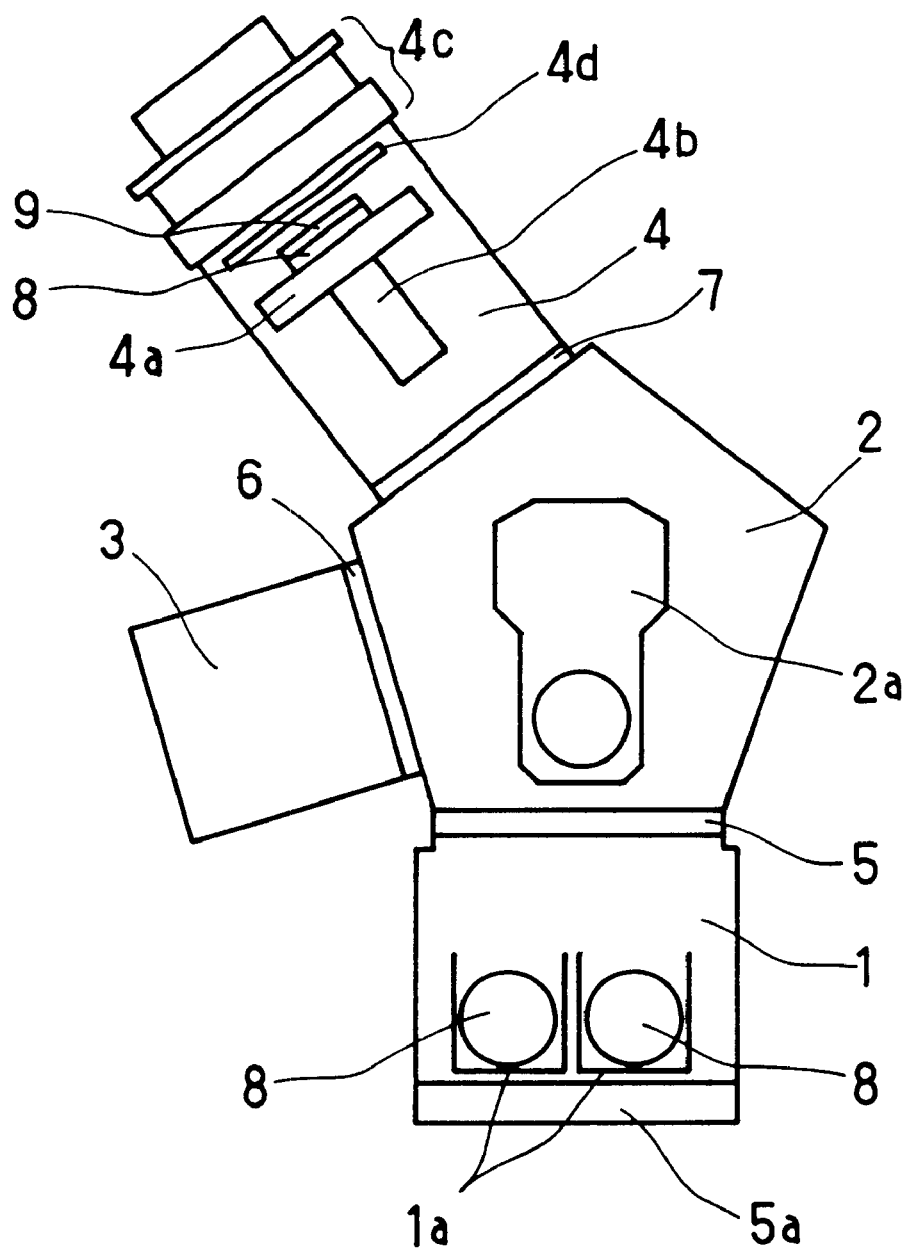
FIG. 1 is a view showing an embodiment of a sputtering apparatus for performing a method for forming a thin film of the present invention.

FIG. 1 shows a sputtering apparatus used in a method for forming a thin film of the present invention. In FIG. 1, the sputtering apparatus includes a load lock chamber 1, a transportation chamber 2, an etching chamber 3, and a sputtering chamber 4, each of which has an independent exhaust mechanism. The load lock chamber 1 and the transportation chamber 2 are connected hermetically via a gate valve 5. The load lock chamber 1 includes a gate valve 5a for introducing cassettes 1a with a plurality of substrates to be treated 8 therein into the sputtering apparatus. The transportation chamber 2 is connected to the etching chamber 3 and the sputtering chamber 4 hermetically via gate valves 6 and 7, respectively. The transportation chamber 2 includes a handling robot 2a for transporting the substrate to be treated 8 to the chambers. The sputtering chamber 4 includes a substrate holder 4a and a transfer mechanism 4b for positioning the substrate 8 perpendicular to the substrate holder 4a, the substrate 8 being transported horizontally to the sputtering chamber 4, and an ITO target 4c with a diameter of 292 mm to which discharge power of direct current voltage is applied, opposing the substrate holder 4a. A shutter 4d is provided between the substrate holder 4a and the ITO target 4c so as to prevent an effect of changes in sputtering discharge due to the change of the discharge power on the formation of thin films.

The formation of an ITO thin film with the sputtering apparatus shown in FIG. 1 is performed, for example, as follows:

First, the gate valve 5a is opened, and two cassettes 1a, each of which contains 25 substrates to be treated 8 with a diameter of 150 mm, are placed in the load lock chamber 1. Then, the gate valve 5a is closed and the load lock chamber 1 is evacuated to vacuum. Then, the gate valves 5 and 6 are opened, and the handling robot 2a transports a first substrate to be treated 8 from the cassette 1a to the etching chamber 3. Thereafter, the gate valves 5 and 6 are closed, and the surface of the first substrate to be treated 8 is bombarded with Ar ions in the etching chamber 3 to clean the surface. Then, the gate valves 6 and 7 are opened, and the first substrate 8 is transported from the etching chamber 3 to the sputtering chamber 4. Then, the gate valves 6 and 7 are closed. The first substrate 8 transported to the sputtering chamber 4 is positioned in the substrate holder 4a by the transfer mechanism 4b. Ar, $H_2$ and $O_2$ are introduced into the sputtering chamber 4 so that the ratio of the gas partial pressures of Ar, $H_2$ and $O_2$ are 96.8%, 2% and 1.2%, respectively. Then, sputtering discharge is started at a gas pressure of 1.33 Pa in the sputtering chamber 4, so that an ITO thin film 9 is formed on the substrate 8 by reactive sputtering. During this time, a second substrate to be treated is transported to the etching chamber 3, and the surface thereof is being cleaned in the same manner as in the first substrate. After the formation of the ITO thin film 9 on the first substrate 8, the gate valves 7 and 5 are opened, and the handling robot 2a returns the first transparent conductive substrate to the original position in the cassette 1a. Then, the gate valves 7 and 5 are closed. The second substrate whose surface has been cleaned in the etching chamber 3 is subjected to the same treatment as for the first substrate. Thereafter, thin films are formed on substrates from a third substrate to a $50^{th}$ substrate in the same manner as described above, and a series of formation processes is completed.

Figure 2:
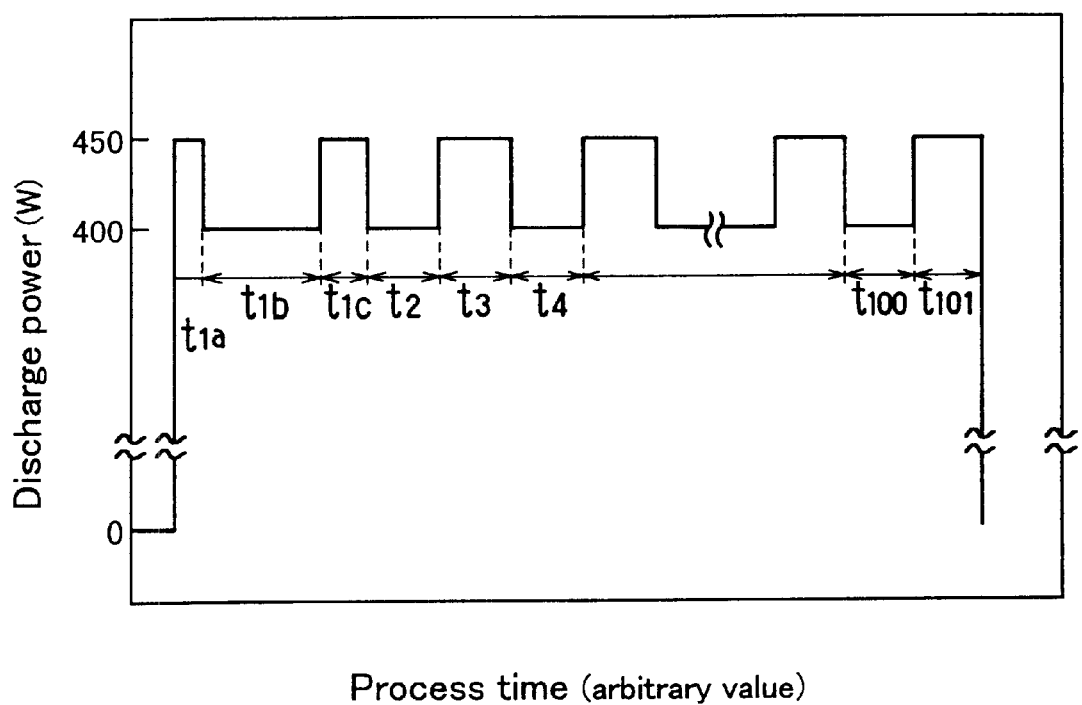
FIG. 2 is a graph showing an embodiment of a sequence of discharge power applied in a method for forming a thin film of the present invention.

FIG. 2 shows a sequence of discharge power applied in the method for forming a thin film of the present invention described above. First, upon introduction of sputtering gases, a discharge power of 450 W is applied for a first idling discharge ($t_{1a}$). Then, a discharge power of 400 W, which is the same power as that for film-formation, is applied for intermediate idling discharge ($t_{1b}$). Then, a discharge power of 450 W is applied for second idling discharge, and a first substrate to be treated is transported to the sputtering chamber ($t_{1c}$). The second idling discharge is performed for the purpose of reducing the change in sputtering discharge due to the opening of the shutter after the second idling, so that it may be performed for a short time. In the formation of ITO thin films in this example, the application time of the discharge power for the intermediate idling discharge $t_{1b}$ is 20 minutes so that the pressure of the sputtering gas and the pressure of an intermediate product produced during the idling discharge are stabilized. The total time of the times $t_{1a}$, $t_{1b}$ and $t_{1c}$ is slightly more than twice the idling discharge time $T_1$ in the conventional example shown in FIG. 6.

The stabilization of the sputtering gas pressure and the pressure of an intermediate product produced during the idling discharge provides the following advantages: to stabilize the state of a target surface by removing residual gas or the like adsorbed on the target surface before the sputtering start; to stabilize a reaction between reactive gas and a target material by reactive sputtering; and to stabilize the formation and the degradation of an intermediate product during sputtering discharge.

In this example, the idling discharge time is set to a value slightly more than twice the idling discharge time in the conventional method to stabilize the sputtering gas pressure and the pressure of the intermediate product produced during the idling discharge. However, as indicated in the results of the analysis with a quadruple mass spectrometer in the conventional method, about 1.2 to 1.3 times the idling discharge time in the conventional method may be sufficient to stabilize the pressure of $H_2O$ as an intermediate product.

Then, the discharge power is lowered to 400 W and the shutter is opened, and an ITO thin film is formed on the first substrate ($t_2$). The shutter is closed and the discharge power is back to 450 W, and a first transparent conductive substrate is transported out before a second substrate to be treated is transported into the sputtering chamber and positioned in the substrate holder ($t_3$). Then, the discharge power is lowered to 400 W and the shutter is opened, and an ITO thin film is formed on the second substrate ($t_4$). The same cycles are repeated until an ITO thin film is formed on a $50^{th}$ substrate to be treated ($t_{100}$). Then, the shutter is closed and the discharge power is raised to 450 W, and a $50^{th}$ transparent conductive substrate is transported out. Thereafter, the supply of the discharge power is stopped to complete the process for forming the thin films ($t_{101}$).

Figure 3:
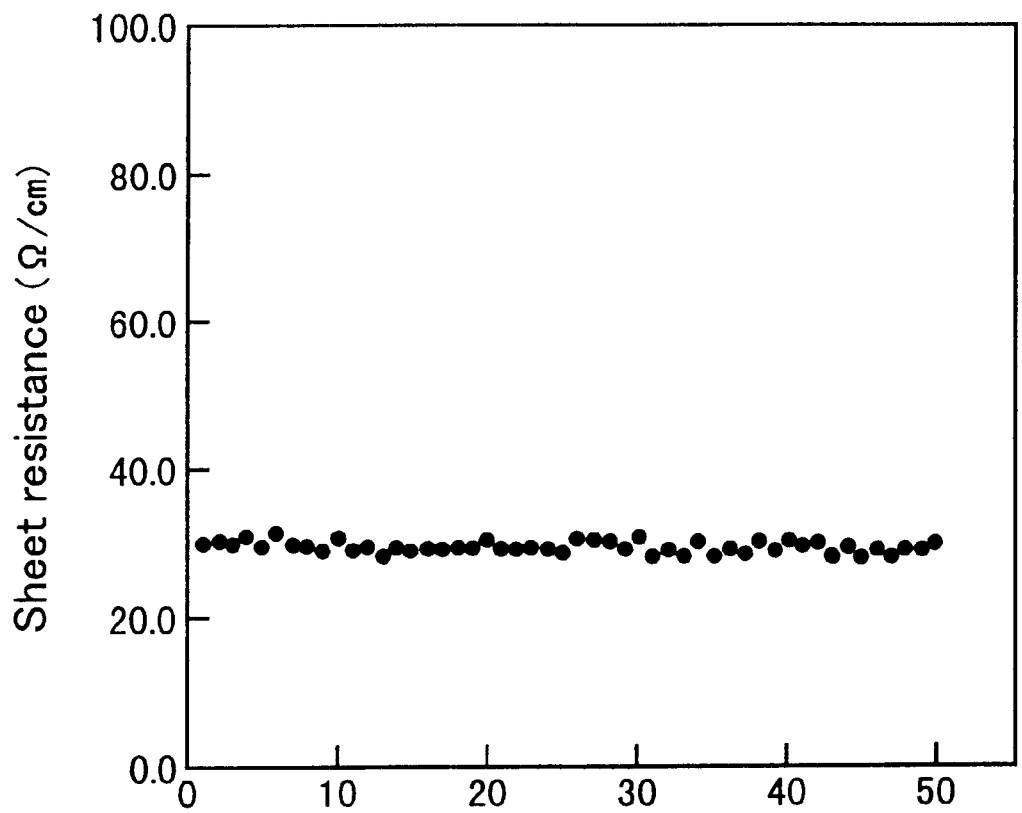
FIG. 3 is a view showing an example of the formation-order-dependence of the sheet resistance of ITO thin films in a method for forming a thin film of the present invention.
Figure 4:
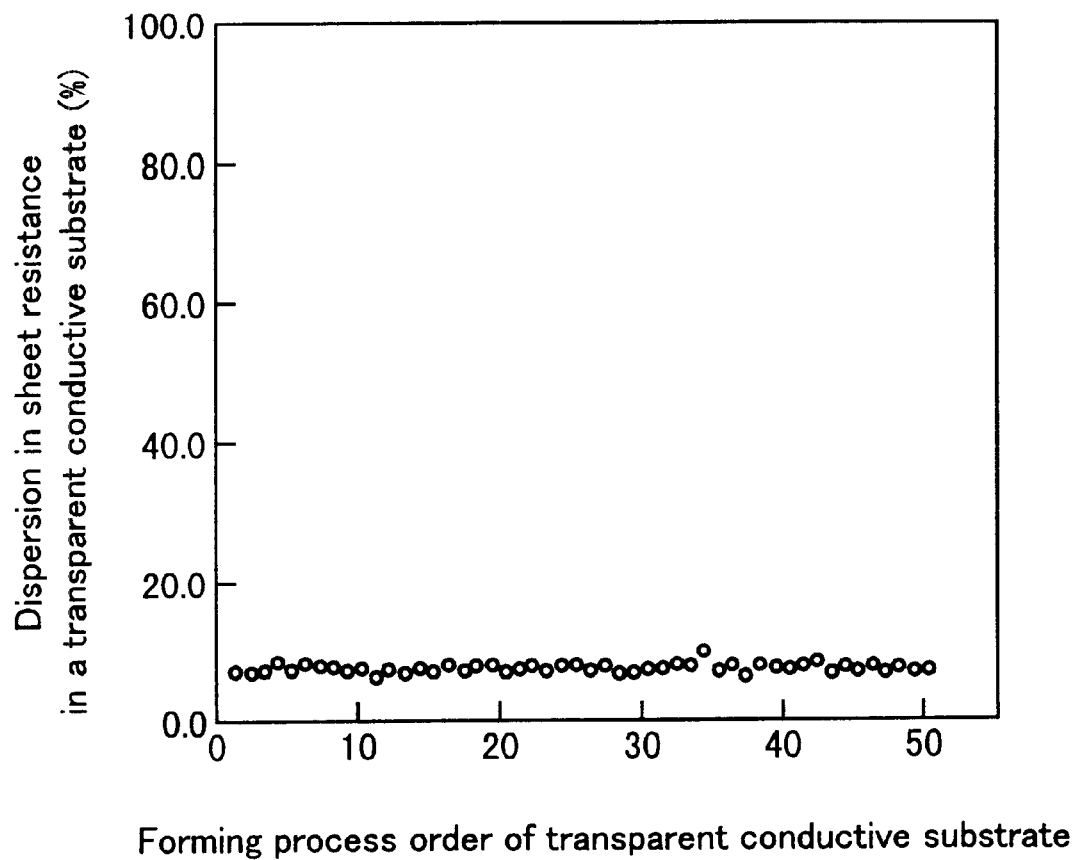
FIG. 4 is a graph showing an example of the formation-order-dependence of the dispersion in the sheet resistance of an ITO thin film in a substrate in a method for forming a thin film of the present invention.

With respect to the 50 transparent conductive substrates on which ITO thin films are formed according to the method for forming a thin film of this embodiment, FIG. 3 shows the sheet resistance of the transparent conductive substrates in the order of the formation process. FIG. 4 shows the dispersion in the sheet resistance in each transparent conductive substrate.

The dispersion in the sheet resistance represents a difference from an average value of values obtained by measuring a sheet resistance at 5 points on a transparent conductive substrate surface with a 150 mm diameter, as in the conventional example described above. FIGS. 3 and 4 show that the sheet resistance of the first to the last transparent conductive substrates is substantially constant (a difference from the average value at measured points is 15% of the average value or less). According to the present invention, when thin films are formed successively on a large number of substrates, uniform and good quality thin films can be formed on all the substrates.

EXAMPLE 2

Hereinafter, a method for forming a thin film according to a second embodiment of the present invention will be described with reference to the accompanying drawings.

In order to investigate the patterning processability of the ITO thin films formed by reactive sputtering, an experiment was performed in the following manner: ITO thin films were formed on the entire surfaces of substrates with a 150 mm diameter with varied discharge power ranging from 200 W to 1000 W at a discharge period $T_2$ for sputtering for formation of ITO thin films in the discharge power sequence shown in FIG. 6. The ITO thin films were etched with a weak acidic etchant comprising oxalic acid as a main component. Then, the etching residue was examined. Table 1 shows the results.

TABLE 1

| Discharge Power (W) | 200 | 400 | 500 | 600 | 800 | 1000 |
|---|---|---|---|---|---|---|
| ITO film Etching Results | Removed by etching | | Slight residue | | ITO film hardly etched | |

As seen from Table 1, the ITO thin films formed at a discharge power of 200 W or 400 W were etched without residue. In the ITO thin films formed at a discharge power of 500 W or 600 W, residue was left in the center portion of the substrate. The ITO thin films formed at a discharge power of 800 W or 1000 W were hardly etched and substantially stayed as they were.

Figure 5:
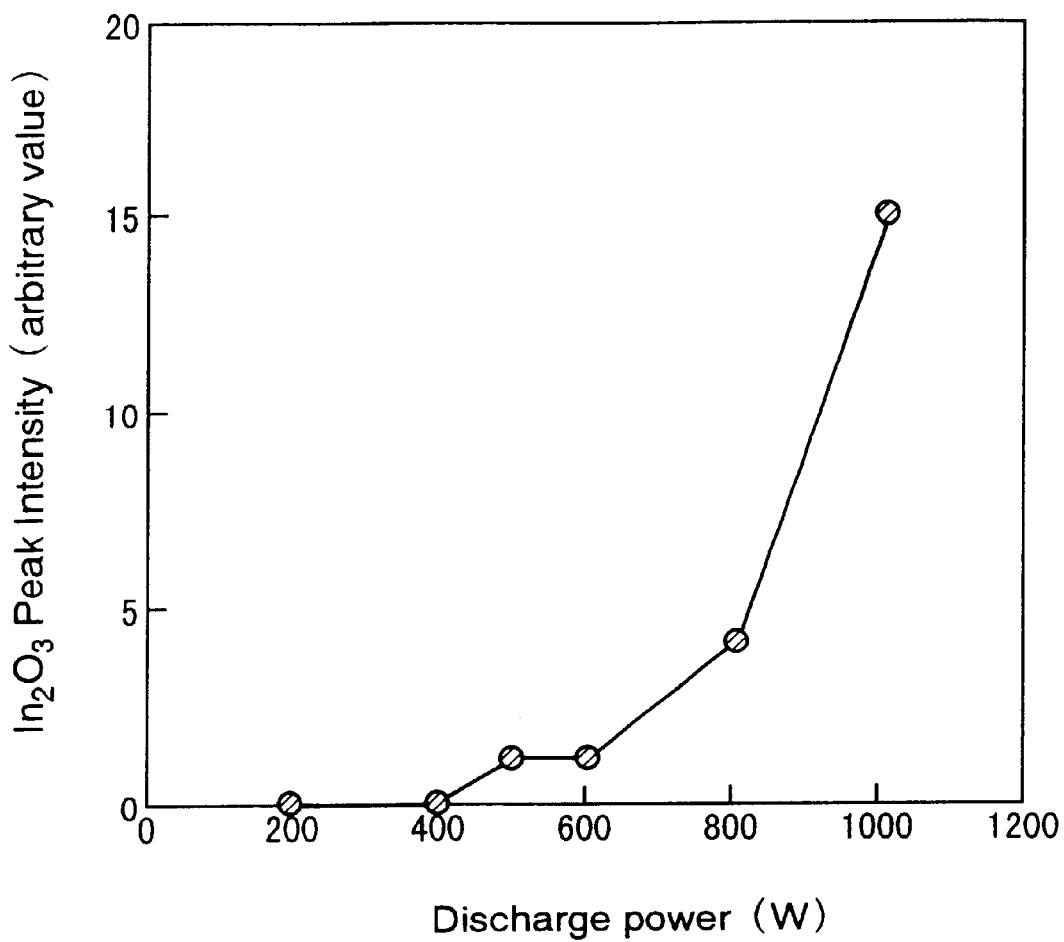
FIG. 5 is a graph showing an example of the crystallinity of indium oxide with respect to the discharge power for idling discharge in a method for forming a thin film of the present invention.

In order to clarify the relationship between the etching residue and the quality of the ITO thin films, experiments were carried out as follows: ITO thin films were formed at various discharge powers ranging from 200 W to 1000 W for sputtering discharge for formation of ITO thin films. The ITO thin films were measured by X-ray diffraction so that the crystallinity of indium oxide ($In_2O_3$) in the ITO thin films was evaluated. FIG. 5 shows the results, i.e., the diffraction peak intensity that depends on the crystallinity of indium oxide with respect to each discharge power. As shown in FIG. 5, for the ITO thin films formed at a discharge power of 200 W or 400 W, crystallinity was not detected and the films were amorphous. For the ITO thin films formed at a discharge power of 500 W or 600 W, the crystallinity increased, and the films were partly crystalline and partly amorphous. On the other hand, the ITO thin films formed at a discharge power of 800 W or 1000 W had a large degree of crystallinity, and the films were changed to be crystalline.

When ITO thin films were formed at a discharge power of 450 W, etching residue was observed in several films. When the thin films formed at a discharge power of 450 W were subjected to a heat treatment of 400° C. so that indium oxide was crystallized completely, the thin films were not etched at all.

The results of the experiments make it believed that for the ITO thin film that is partly amorphous and partly crystalline, crystalline portions of the film are etched slower than amorphous portions of the film or are hardly etched, thus causing variations in etching degrees in the ITO thin film and thus causing etching residue. In other words, the discharge power has a great effect on the quality of the formed ITO thin film.

Figure 6:
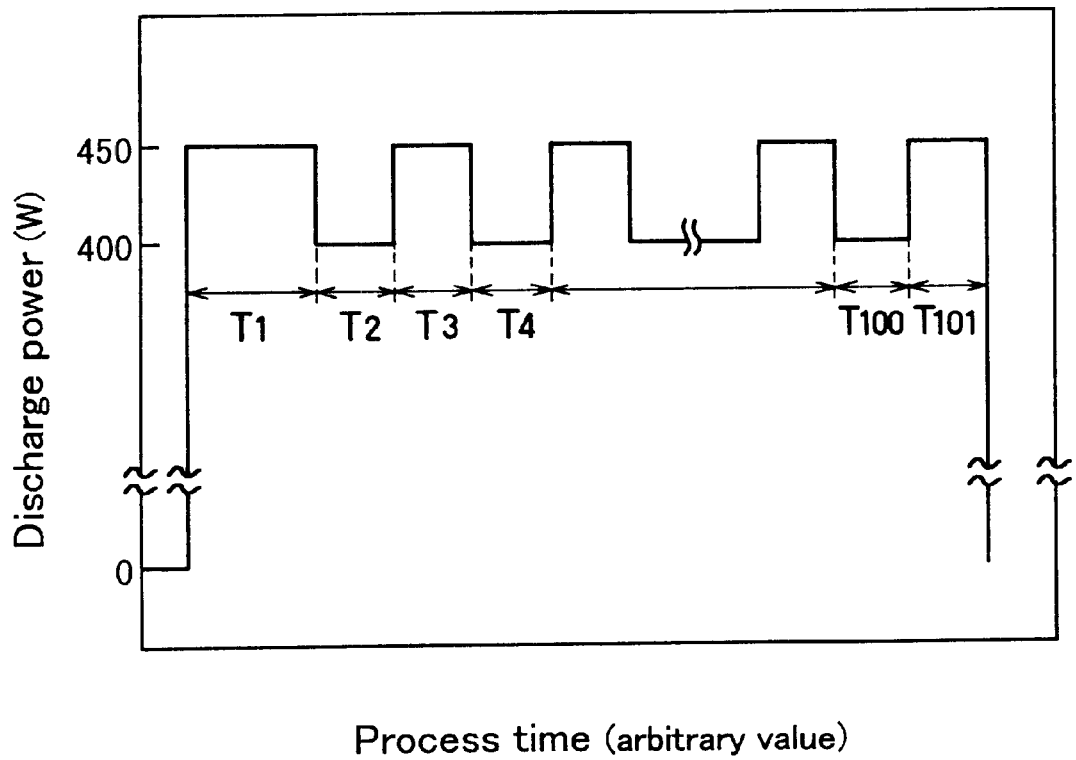
FIG. 6 is a graph showing a sequence of discharge power applied in a conventional method.
Figure 7:
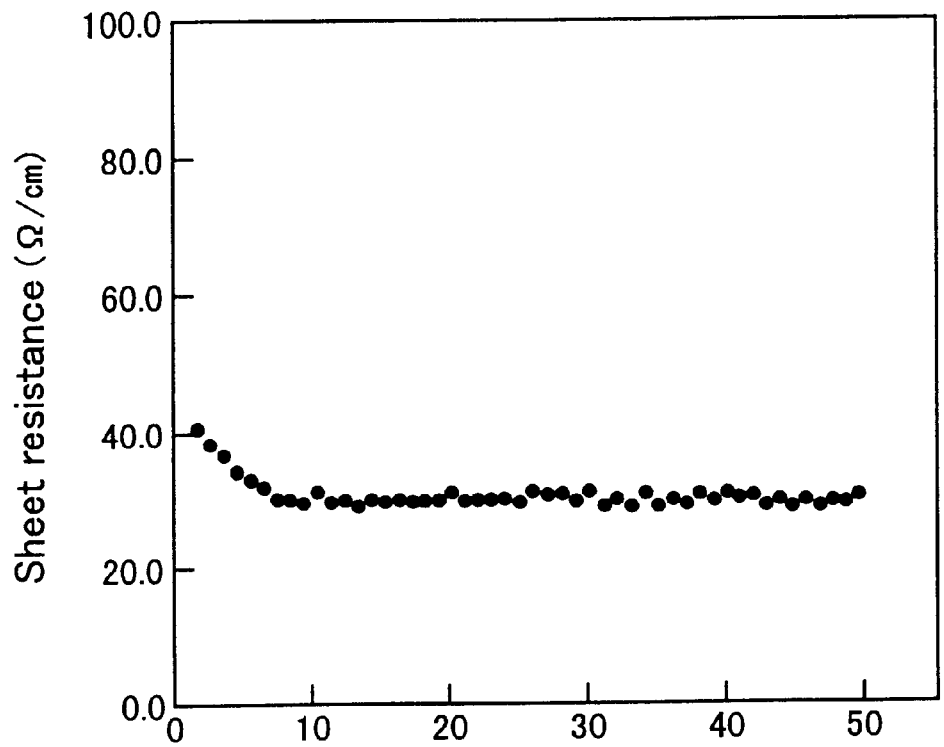
FIG. 7 is a graph showing the formation-order-dependence of the sheet resistance of ITO thin films in a conventional method.
Figure 8:
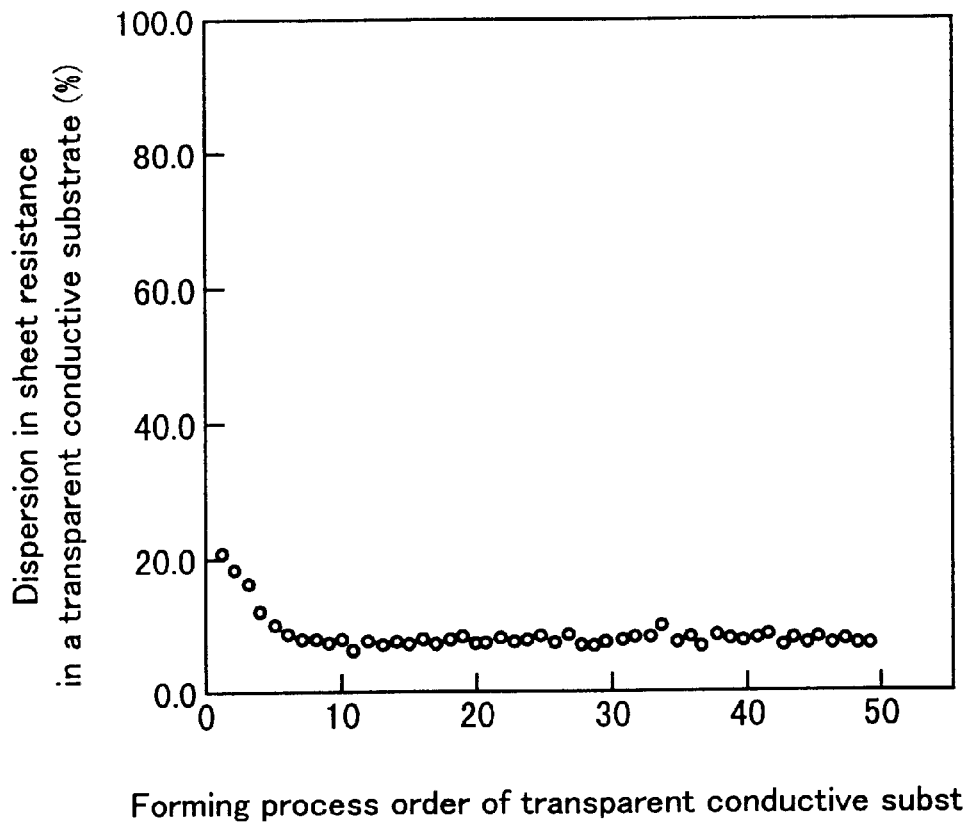
FIG. 8 is a graph showing the formation-order-dependence of the dispersion in the sheet resistance of an ITO thin film in a substrate in a conventional method.
Figure 9:
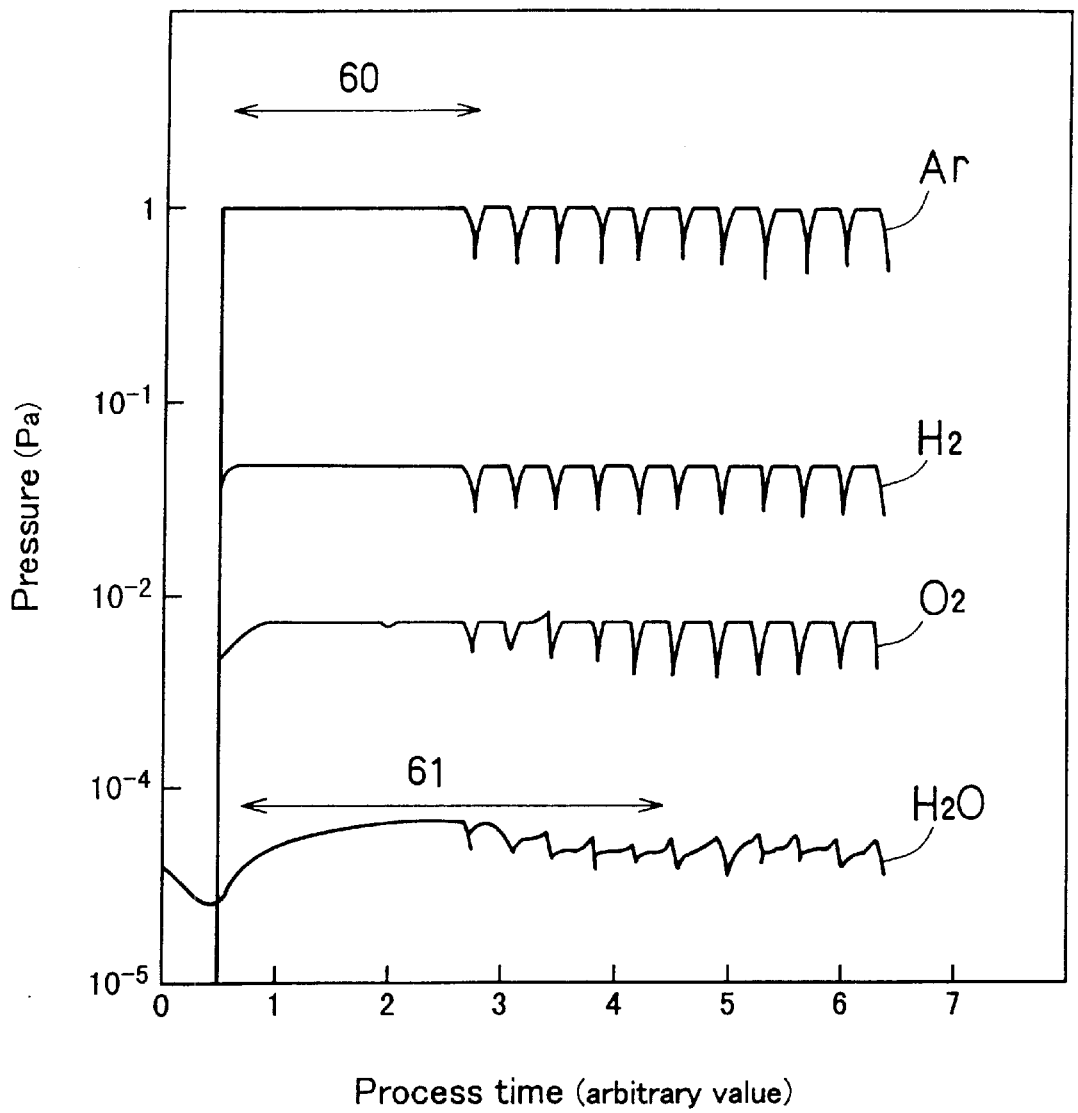
FIG. 9 is a graph showing changes over time in introduced gases and an intermediate product during reactive sputtering.

In the discharge power sequence in FIG. 6, when the value of the discharge power at the idling discharge $T_1$ was raised, etching residue was seen as above. When ITO thin films were formed successively on a plurality of substrates, etching residue was seen in transparent conductive substrates produced early in the order of the thin film formation. This indicates that the discharge power for idling discharge has a great effect on the quality of the ITO thin film as above.

It is believed that a high discharge power at sputtering discharge for formation of an ITO thin film or a high discharge power at idling discharge accelerates the crystallization of the ITO thin film for the following reason: particles for sputtering that have been exited to a high energy state in a target surface or a plasma region reach a surface of a substrate, and the high energy is transmitted to the ITO thin film that is being formed. This accelerates the crystallization.

Especially, when ITO thin films are formed successively on a plurality of substrates at an idling discharge power higher than a discharge power for formation of ITO thin films, the ITO thin films formed in an early stage in the forming process order have different quality from that of the ITO thin films formed in a later stage in the forming process order, even if the discharge power for the formation of the ITO thin films is the same. This is because the ITO thin films formed in an early stage are affected by the sputtered particles that have been significantly excited during idling discharge. Therefore, the ITO thin films formed in an early stage have a different etching rate from that of the ITO thin films formed in a later stage in the forming process order.

Each transparent conductive substrate has a different rate for etching the ITO thin film, thus requiring adjustment of etching time for the ITO thin film for every transparent conductive substrate in the patterning process, although the transparent conductive substrates are successively produced. This causes a large problem in production.

When etching was performed with respect to the ITO thin films of the 50 transparent conductive substrates produced in the method of the present invention whose sequence is shown in FIG. 2, there was no difference in the etching rate, and there was no residue and every portion was etched completely. In order words, according to the present invention, even when thin films are successively formed on a large number of substrates, all the substrates have good quality and uniform thin films.

In the sequence conditions shown in FIG. 2, the total time of $t_{1a}$ and $t_{1c}$ is several minutes to about 5 minutes, and a period $t_{1b}$ is 20 minutes. When ITO thin films are formed under a period $t_{1b}$ of 40 minutes, there was no difference in the etching rate, and there was no residue and every portion was etched completely as above. This indicates that even if idling discharge is performed at the same discharge value as that for ITO thin film formation for a long time, crystallization is not caused in the ITO thin films, and thus the crystallization is caused in the ITO thin films by the energy of sputtered particles.

In the embodiments of the present invention, the ITO thin films have been described. However, the method for forming a thin film of the present invention can be used for any types of films such as oxide films or metal films. Furthermore, the idling discharge time after the start of reactive sputtering can be set arbitrarily depending on the type or a desired quality of thin films to be formed. Furthermore, either direct current discharge or high frequency discharge can be used for the sputtering discharge, depending on the type or a desired quality of thin films to be formed, and the discharge power is not limited to a specific value. In the embodiments of the present invention, the shutter is used in the sputtering apparatus, but a sputtering apparatus without a shutter may be used.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for forming films on substrates comprising the steps of:
   performing idling discharge for reactive sputtering with introduction of sputtering gas composed of a plurality of gases and application of discharge power in a sputtering chamber until a pressure of a product produced from the plurality of gases in the sputtering gas by the idling discharge becomes substantially constant; and
   forming films on substrates in the sputtering chamber by the reactive sputtering while introducing the substrates to be treated into the sputtering chamber and removing the substrates from the sputtering chamber, one at a time, sequentially wherein
      the idling discharge is performed sequentially at divided periods including a first period, a second period, and a third period,
      during at least a part of a period in the step of performing idling discharge, the discharge power is not more than a discharge power at which the films are formed on the substrates,
      a discharge power for the first and third periods is higher than a discharge power at which films are formed by reactive sputtering, and
      a discharge power for the second period is not more than the discharge power at which films are formed by reactive sputtering.

2. The method according to claim 1, wherein the films comprise a metal oxide.

3. The method according to claim 2, wherein the metal oxide is at least one selected from the group consisting of indium tin oxide, indium oxide and tin oxide.

4. The method according to claim 1, wherein the films are transparent conductive films.

5. The method according to claim 4, wherein sheet resistance values in each transparent conductive film in a group of films prepared sequentially are in a range in which a difference from an average value of the sheet resistance values in the same film is 15% of the average value or less.

6. The method according to claim 1, wherein the film is formed of a single phase.

7. The method according to claim 6, wherein the single phase is an amorphous phase.

8. The method according to claim 1, wherein said sputtering gas comprises hydrogen gas and oxygen gas, and said product is $H_2O$.

9. A method for forming films on substrates comprising the steps of:
   performing idling discharge for reactive sputtering with introduction of sputtering gas and application of discharge power in a sputtering chamber sequentially at divided periods including a first period, a second period and a third period sequentially, in such manner that a discharge power for the third period is higher than the discharge power at which films are formed by reactive sputtering, and a discharge power for the second period is not more than the discharge power at which films are formed by reactive sputtering; and
   forming films on substrates in the sputtering chamber by the reactive sputtering while introducing the substrates to be treated into the sputtering chamber and removing the substrate from the sputtering chamber, one at a time, sequentially.

10. The method according to claim 9, wherein in the step of performing idling discharge, the idling discharge is performed until a pressure of a product produced from the sputtering gas by the idling discharge reaches a stationary state.

11. The method according to claim 10, wherein the pressure becomes substantially constant.

12. The method according to claim 9, wherein
   a discharge power for the first period is higher than the discharge power at which films are formed by reactive sputtering.

13. The method according to claim 9, wherein the films comprise a metal oxide.

14. The method according to claim 13, wherein the metal oxide is at least one selected from the group consisting of indium tin oxide, indium oxide and tin oxide.

15. The method according to claim 9, wherein the films are transparent conductive films.

16. The method according to claim 9, wherein sheet resistance values in each transparent conductive film in a group of films prepared sequentially are in a range in which a difference from an average value of the sheet resistance values in the same film is 15% of the average or less.

17. The method according to claim 9, wherein the film is formed of a single phase.

18. The method according to claim 17, wherein the single phase is an amorphous phase.

19. The method according to claim 9, wherein said idling discharge is performed alternately with a plurality of said forming of films on sequential substrates.

* * * * *